US010534024B2

(12) United States Patent
Mittelstadt et al.

(10) Patent No.: US 10,534,024 B2
(45) Date of Patent: Jan. 14, 2020

(54) SINGLE POLE LOW-COST EXPANDABLE SMART PANEL MONITORING AND CONTROL SYSTEM

(71) Applicant: Schneider Electric USA, Inc., Andover, MA (US)

(72) Inventors: Chad Mittelstadt, Cedar Rapids, IA (US); Paul Reid, Cedar Rapids, IA (US)

(73) Assignee: Schneider Electric USA, Inc., Andover, MA (US)

( * ) Notice: Subject to any disclaimer, the term of this patent is extended or adjusted under 35 U.S.C. 154(b) by 210 days.

(21) Appl. No.: 15/852,255

(22) Filed: Dec. 22, 2017

(65) Prior Publication Data
US 2019/0195926 A1 Jun. 27, 2019

(51) Int. Cl.
*H02J 3/14* (2006.01)
*G01R 22/06* (2006.01)
*H02J 13/00* (2006.01)
*G01D 4/00* (2006.01)

(52) U.S. Cl.
CPC .......... *G01R 22/063* (2013.01); *H02J 13/002* (2013.01); *H02J 13/0062* (2013.01); *H02J 13/0075* (2013.01); *G01D 4/002* (2013.01); *H02J 2003/143* (2013.01)

(58) Field of Classification Search
CPC .. G01R 22/063; H02J 13/002; H02J 13/0062; H02J 13/0075; H02J 2003/143; G01D 4/002
See application file for complete search history.

(56) References Cited

U.S. PATENT DOCUMENTS

| 6,999,291 B2* | 2/2006 | Andarawis ............... G06F 1/12 361/64 |
| 8,849,472 B2 | 9/2014 | Pugh et al. |
| 9,726,726 B2* | 8/2017 | Bock .................... H01H 47/002 |
| 2004/0075343 A1 | 4/2004 | Wareham et al. |
| 2006/0190140 A1* | 8/2006 | Soni ........................ H02J 3/14 700/295 |

(Continued)

OTHER PUBLICATIONS

"Energy management circuit breaker", downloaded from http://www.eaton.com/FTC/utilities/EMCB/index.htm?wtr on Jan. 9, 2018, 2 pages.

(Continued)

*Primary Examiner* — Jared Fureman
*Assistant Examiner* — Esayas G Yeshaw
(74) *Attorney, Agent, or Firm* — Locke Lord LLP

(57) ABSTRACT

A modular monitoring and control system for NEMA-style load center smart electrical distribution panels is built up from interconnectable modules, starting with a Base Unit for monitoring and reporting on select branch circuits, then adding a Control Module for Remotely Operated breakers or additional current monitoring or both; and/or adding a separate Expansion Module with Current Transformer expansion capabilities for adding a larger number of power monitors within the load center. The modules plug into breaker pole slots within the panel for ease of installation and are independent of the breakers. The system keeps initial smart panel costs low by placing monitoring and control functionality and required parts into add-on modules.

15 Claims, 5 Drawing Sheets

(56) References Cited

U.S. PATENT DOCUMENTS

| | | | | |
|---|---|---|---|---|
| 2012/0200412 A1* | 8/2012 | Boettner | ............. | H04Q 9/00 |
| | | | | 340/540 |
| 2013/0345888 A1* | 12/2013 | Forbes, Jr. | ............. | H02J 3/14 |
| | | | | 700/291 |
| 2014/0211345 A1* | 7/2014 | Thompson | ............. | B60L 53/68 |
| | | | | 361/42 |
| 2014/0236365 A1* | 8/2014 | Martin | ............. | H04B 3/54 |
| | | | | 700/286 |
| 2015/0261231 A1* | 9/2015 | Jiang | ............. | G05F 1/12 |
| | | | | 307/31 |

OTHER PUBLICATIONS

"EPRI, Eaton to demo power management circuit breaker", Electric Light & Power, PowerGrid International, Oct. 26, 2016, 3 pages.

* cited by examiner

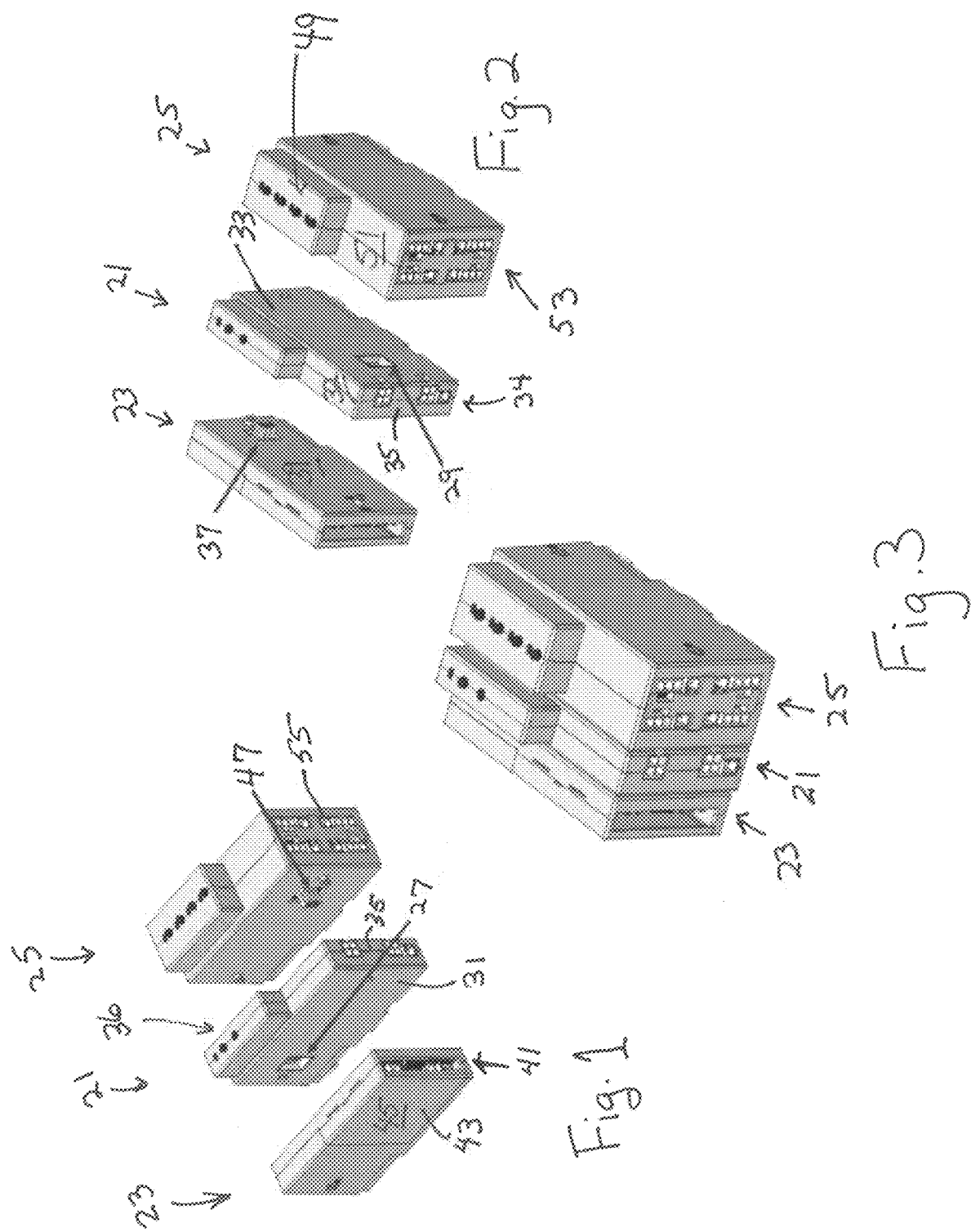

SINGLE POLE LOW-COST EXPANDABLE SMART PANEL MONITORING AND CONTROL SYSTEM

BACKGROUND

The so called "smart electrical distribution panel," or "smart panel" for short, is a load center type panel board, typically residential, which is able to monitor, and preferably control, the consumption of electricity in a house or office in order to obtain increased electrical demand control and cost control within the house and energy efficiency for the grid as a whole. The smart panel offers several advantages to the modern electrical grid user. However, there are no known systems/product architectures on the market today which will modernize and retrofit the large installed base of existing standard load centers lacking the necessary monitoring and control capabilities, and which provide four basic criteria for this retrofit, namely: 1) enabling easy installation of monitoring and control equipment securely into a load center like a plug on circuit breaker, while 2) enabling a user interface through the load center cover like a plug on circuit breaker, and 3) providing a scalable offer of functionality and control, starting with a "low cost" base unit that works alone with a basic number of Current Transformers (CTs), or other type power monitors, for monitoring and reporting on critical loads, and then adding other modules, such as an Expansion Module to do mass monitoring with additional CTs; or adding a Control Module for panels equipped with remotely operated breakers, all while 4) keeping the module sizes small and functions narrow, such that the low cost and small footprint of the base unit might be cost effective enough that the base unit could be included in the initial load center purchase, thus enabling a high rate of acceptance, connectivity, and interaction between end users and energy providers throughout the future residential grid.

SUMMARY

In order to accomplish improvements to the art satisfying the above criteria, the present invention teaches an improvement to load center electrical distribution panels comprising a multi-level addition from a three module set of interconnectable add-ons which are pluggable into the distribution panel to increase their smart panel capabilities one level at a time. At one level, a first aspect of the invention in a residential-type load center electrical distribution panel for plug on miniature circuit breakers, provides the improvement comprising: a) a Base Unit with a self-contained Base Unit housing fitting in a breaker slot of the Load Center for monitoring branch circuit activity and having first and second multi-pin connectors extending through opposite sidewalls of the housing; the first multi-pin connector on one side of the housing for connecting a CT Expansion Module to an electronics platform within the Base Unit housing, the second multi-pin connector on the opposite side of the housing for connecting a Control Module for remotely Operated breakers to the electronics platform within the Base Unit housing; and a plurality of CT input receptacles extending through the front of the Base Unit housing: and a line power terminal jaw for attachment to a power bus of the electrical distribution panel; an Electronics Platform within the Base Unit housing having: a microprocessor, preferably being a Microcontroller; within the housing, the Microprocessor connected to: a Power Supply circuit, the Power Supply circuit having a rectifier power supply for powering components of the Electronics platform; a Communications circuit, the Communications circuit having a coupling circuit for connection to the electrical grid; and an Energy monitoring circuit; the Energy monitoring circuit having circuitry for monitoring input from the plurality of CT input receptacles in the Base Unit housing.

In a second aspect, the improvement in a residential-type load center electrical distribution panel for plug on miniature circuit breakers, according to this first aspect may further include, wherein the Base Unit housing is a single pole housing.

In a third aspect the improvement for a residential-type load center electrical distribution panel for plug on miniature circuit breakers, may add to the first aspect above and further comprise:
an Expansion Module with a self-contained CT Expansion Module housing for a fitting in a breaker slot and having a multi-pin connector on one side of its Expansion Module housing for mating with one of the multi-pin connectors of the Base Unit housing to allow information from additional CTs to be connected to the Electronics Platform of Base unit housing, including
a Branch CT Input Array with a plurality of CT connectors to enable the additional CTs to be connected within the electrical distribution panel via the CT Expansion module housing,
and a Multi-Circuit Energy Monitoring IC array inside the Expansion module having circuitry for monitoring information from the additional CTs and forwarding the information from the additional CTs to the Base Unit housing.

In a fourth aspect the improvement in a residential-type load center electrical distribution panel for plug on miniature circuit breakers according to the third aspect, may include the multi-pin connector being a projectable connector.

In a fifth aspect the improvement for a residential-type load center electrical distribution panel for plug on miniature circuit breakers, may add to the first aspect above and further comprise:
a Control Module with a self-contained Remotely Operated Breaker Control Module housing for a fitting in a breaker slot;
the Control Module housing having a multi-pin connector on one side of its housing for mating with one of the multi-pin connectors of the Base Unit housing to enable monitoring and control of a plurality of Remotely Operated breakers attached within the electrical distribution panel and allowing information to be exchanged between the Base unit and the Control Module,
and
the Control Module having a line jaw connectable to an electrical distribution panel power bus; and
an Energy Storage Device for providing operating power to Remotely Operated Breakers located within the Electrical Distribution Panel,
the Energy Storage Device being connected to a Remotely Operated Control Brick for operation of the Remotely Operated Breakers; and
the Remotely Operated Control Brick further connected via a communications bus with the multi-pin connector and further having a plurality of Remotely Operated breaker control port outputs.

In a sixth aspect the improvement in a residential-type load center electrical distribution panel for plug on miniature circuit breakers according to the fifth aspect, further provides that the Control Module occupies two breaker slots.

In a seventh aspect the improvement in a residential-type load center electrical distribution panel for plug on miniature circuit breakers according to the fifth aspect, further provides that the multi-pin connector is a projectable connector.

In other aspects of the present invention in a residential-type load center electrical distribution panel for plug on miniature circuit breakers, the improvement is comprising: a) a self-contained Base Unit housing fitting in a breaker slot of the Load Center for monitoring branch circuit activity and having 1) first and second multi-pin connectors extending through opposite sidewalls of the housing; the first multi-pin connector on one side of the housing for connecting a Current Transformer (CT) Expansion Module to an electronics platform within the housing, the second multi-pin connector on the opposite side of the housing for connecting a Control Module for remotely Operated breakers to the electronics platform within the housing; and 2) a plurality of CT input receptacles extending through the front of the housing; and 3) a line power terminal jaw for attachment to a power bus of the electrical distribution panel; with b) the electronics platform within the Base Unit having: 1—a Microprocessor within the housing, the Microprocessor connected to 2—a Power Supply circuit, 3—a Power Line Communications (PLC) circuit, 4—an I/O circuit, 5—an Energy monitoring circuit, 6—a Surge Protection Device Monitor, and 7-a Wireless Communications Circuit; with: the Power Supply circuit having a power supply front end protection and filter circuit connected to the line power terminal jaw; and an AC to DC rectifier power supply connected to the power supply front end protection and filter circuit; the Power Line Communications circuit having a power line communications high voltage coupling circuit connected to the line jaw, and a PLC communications device connected to the PLC high voltage coupling circuit; the I/O CIRCUIT having at least one status indicator, a reset button, and a PLC pairing button module accessible through the top of the Base Unit housing; the energy monitoring circuit having circuitry for monitoring input from the plurality of CT input receptacles extending through the housing and connected to the energy monitoring circuit; the surge protection device monitor having a status input circuit and a plug in receptacle extending through the housing and connected to a Surge Protection Device, such as a whole house protection device which is located elsewhere in the electrical distribution panel, i.e. not a part of the Base Unit; the wireless circuit having a wireless communications transceiver; and a Signal Conditioning Unit for the energy monitoring circuit voltage inputs connected between the power supply front end protection and filter circuit and the CT extension module connector; and the electronics platform further including a nonvolatile memory connected to the Microprocessor.

In additional aspects the improvement may include the first and second multi-pin connectors being recessed female six pin connectors. In other additional aspects the improvement may include the housing being a single pole housing. In other additional aspects the improvement may include the status indicator being a visible status indicator such as an LED.

In another aspect of the present invention the improvement for a residential-type load center electrical distribution panel for plug on miniature circuit breakers further comprises: a CT Expansion Module in a self-contained housing for a fitting in a breaker slot and having a multi-pin connector on one side of its housing for mating with one of the multi-pin connectors of the Base Unit to enable additional CTs to be connected within the electrical distribution panel and allow information from the additional CTs to be connected to the Base unit, and including a Branch CT Input Array with a plurality of CT connectors extending from the outside of the CT expansion module housing and connected to a Multi-Circuit Energy Monitoring IC array inside the module; and a voltage conditioning unit connected between the multi-pin Connector and the Multi-Circuit Energy Monitoring IC array. In addition this aspect of the improvement in a residential-type load center electrical distribution panel for plug on miniature circuit breakers, may include wherein the multi-pin connector is a projectable connector.

In another aspect of the present invention the improvement for a residential-type load center electrical distribution panel for plug on miniature circuit breakers, further comprises a Remotely Operated Breaker Control Module in a self-contained housing for a fitting in a breaker slot and having a multi-pin connector on one side of its housing for mating with one of the multi-pin connectors of the Base Unit to enable monitoring and control of a plurality of Remotely Operated breakers attached within the electrical distribution panel and allow information to be exchanged between the Base unit and the Control Module, with the Control Module having a line jaw connectable to an electrical distribution panel power bus; a Power Input Filtering Overcurrent Protection and Surge Protection module (or just "Input Filter" for simplicity) connected to the line jaw; the Input Filter connected to a Charging Circuit, which is connected to a Remotely Operated circuit breaker actuator Energy Storage Device, the Energy Storage Device being connected to a Remotely Operated Control Brick for operation of the Remotely Operated Breakers; the Remotely Operated Control Brick further having communications via a communications bus, with the multi-pin connector and further having a plurality of Remotely Operated breaker control port outputs; and the Control Module further having a plurality of CT Input receptacles extending through the Control module housing and leading to an Energy Monitoring Circuit for an additional plurality of CTs within the electrical distribution panel, the Energy Monitoring Circuit connected to the Remotely Operated Control Brick and the Control Module connector, and the Control Module further having a top-mounted I/O module with local override control buttons and a status indicator accessible to a human operator through the top of the housing; the I/O module being linked in two-way communications to the Remotely Operated Control Brick.

In additional aspects of the present invention the improvement for a residential-type load center electrical distribution panel for plug on miniature circuit breakers the Control Module may occupy two breaker slots. In other aspects of the present invention the improvement may include the multi-pin connector for the Control Module being a projectable connector.

BRIEF DESCRIPTION OF THE DRAWINGS

The foregoing and other advantages of the disclosed embodiments will become apparent upon reading the following detailed description and upon reference to the drawings, wherein:

FIG. 1 is a top left side perspective exterior view of the separated modules.

FIG. 2 is a top right side perspective exterior view of the separated modules.

FIG. 3 is a top right side perspective exterior view of the joined modules.

DETAILED DESCRIPTION

Figure 4:
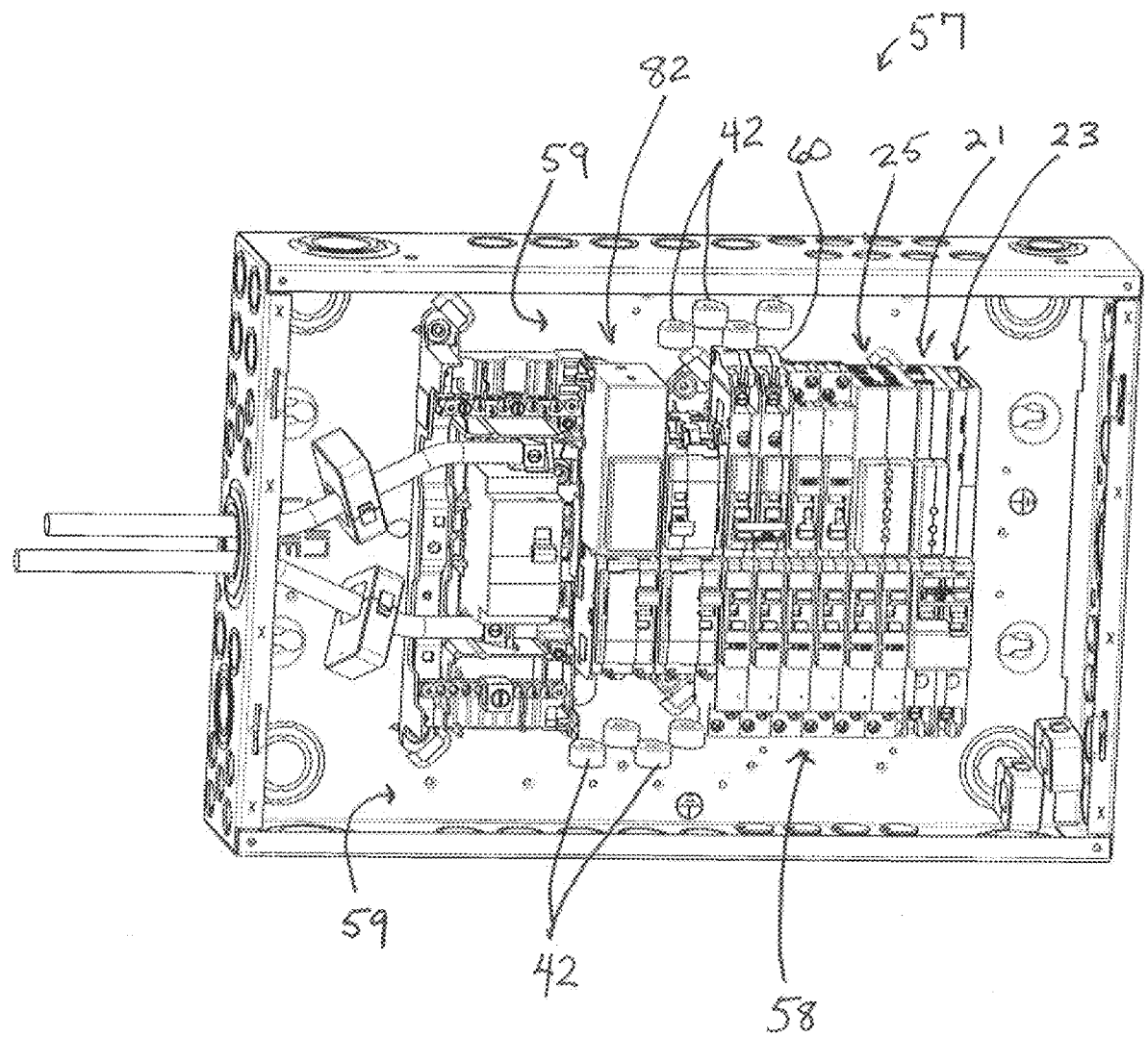
FIG. 4 is a front view of a Load Center type electrical distribution panel with the dead front removed for viewing the circuit breakers and monitoring and control modules of the present invention installed therein.

As an initial matter, it will be appreciated that the development of an actual commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Further, words of degree, such as "about," "substantially," and the like may be used herein in the sense of "at, or nearly at, when given the manufacturing, design, and material tolerances inherent in the stated circumstances" and are used to prevent the unscrupulous infringer from unfairly taking advantage of the invention disclosure where exact or absolute figures and operational or structural relationships are stated as an aid to understanding the invention.

FIG. 1, FIG. 2, and FIG. 3 represent exemplary embodiments of the exteriors of three modules comprising the expandable monitoring and control system for a smart panel of the present invention. The three basic modules are the Base Unit 21, the CT Expansion Module 23 and the Control Module 25 for Remotely Operated (RO) breakers. The base unit 21 is the hub for monitoring and communications of the expandable smart panel system for upgrading standard load centers as provided by the present invention and should be added to the load center as a first unit. The Base Unit 21 includes recessed female connectors 27, 29 and its first and second lateral sides 31, 33 respectively, and further includes CT connection receptacles 34 at the "front" surface 35, i.e. that surface which will face the wiring gutter of the panel. The Base Unit 21 has a top side 32, which will be visible through the front cover dead front of the panel and available to the operator, with status indicator light, reset button, and PLC pairing button, collectively referred to here as its I/O Circuit 36, as further explained below.

The CT (Current Transformer) Expansion module 23 allows for the adding of more CTs as energy sensors with the distribution panel (FIG. 4) when connected to the Base Unit 21. The CT Expansion module includes an extendable male side connector 37 on a first side 39 thereof for mating with the Base Unit first side female connector 27. The Expansion module has an open front face 41 for allowing CT wire routing when the CTs (e.g. collectively 42, FIG. 4) are added to connection clips (FIG. 6) behind a removable side panel 43 at the second lateral side 45 of the Expansion module 23.

The Control Module 25 allows for the control of Remotely Operated circuit breakers 60 (FIG. 4) such as Schneider Electric's SQUARE D brand POWERLINK circuit breakers which can be turned on and off via remote command, whether wired or wirelessly sent, when connected to the Base Unit 21 through its extendable male side connector 47 shown in a projected position on its first side 39 of the Control module 25 for mating with the Base Unit second side female connector 29. The control module 25 also has its own I/O circuit 49 at the top surface 51 thereof, providing operator access through the panel dead front to local override control buttons and indicators such as LEDs. The Control module has plug in connection receptacles 53 for CT connection on its front face 55 when the CTs (e.g. collectively 42, FIG. 4) are added to the control module 25.

As seen in FIG. 4, a residential-type load center electrical distribution panel 57 for plug on miniature circuit breakers, collectively 58, has each of the Base Unit 21, the CT expansion module 23 and the Control module 25 connected side by side to each other within the electrical distribution panel 57 with the module side connectors (not visible) mated and the Base Unit and the Control module anchored to a power bus of the electrical distribution panel 57 by their respective line jaw electrical connections as discussed below. The electrical distribution panel 57 does not have the front panel dead front installed so that the wiring gutters, collectively 59, and other interior detail of the panel 57 can be observed. It will be noted that the front surfaces 35, 41, 55 of the Base Unit, Expansion Module, and Control module, respectively, all face toward the top wiring gutter 59 as shown in the figure.

Figure 5:
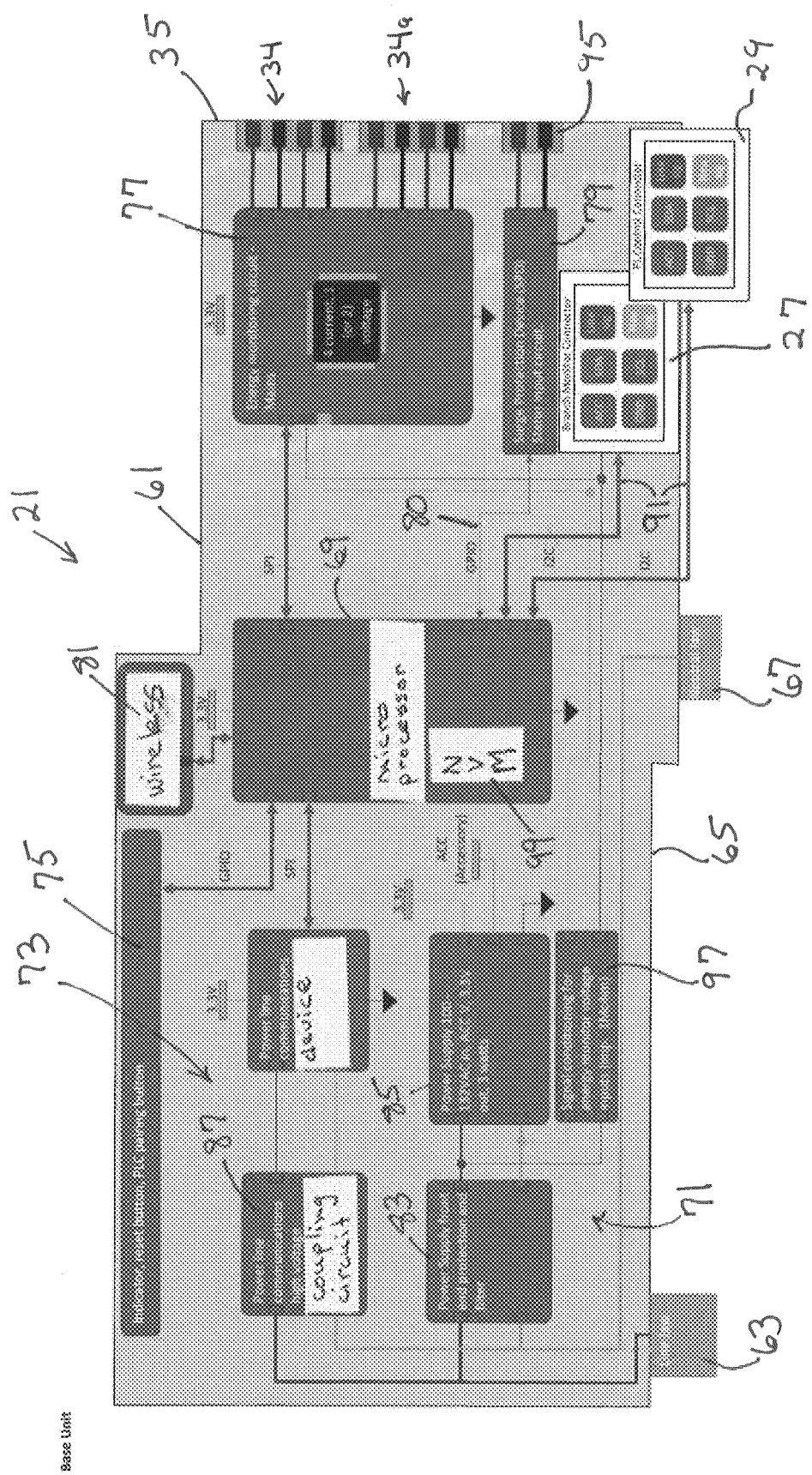
FIG. 5 is an exemplary functional block diagram of the Base Unit module of the present system.

As seen in FIG. 5, a schematic side view representation of the Base Unit 21 illustrating blocks of functional components and various connectors. A self-contained Base Unit housing 61 is sized for fitting in a single pole breaker slot of the Load Center (FIG. 4) for monitoring branch circuit activity such as four select branches most needing monitoring. The Base Unit 21 has its first and second multi-pin connectors 27, 29 extending through opposite sidewalls of the housing per above. The first multi-pin connector 27 is on one side of the housing 21 for connecting the CT Expansion Module 23 to the electronics platform within the Base Unit housing 61 via a six pin female connector flush mounted to the housing side wall. The second multi-pin connector 29, also six pin female, is flush mounted to the opposite side of the housing 61 for connecting the Control Module 25 for remotely Operated breakers to the electronics platform of the Base Unit 21. The exemplary pin out on the illustrated connectors is pins ACC and GND (Ground) for power supply voltage; pins SDA and SCL for serial communications transfer, e.g. a data line and a clock line; and a pair of pins for line voltage signal comparisons, namely Line sig (signal) and Neu sig (neutral signal). However, other connecting pin arrangements may be suitable.

A plurality of CT input receptacles 34 extend through the front 35 of the housing. A line power terminal jaw 63 for attachment to a power bus of the electrical distribution panel is located on the bottom surface 65. A neutral jaw 67 for the Base Unit 21 may also be located on its bottom surface 65 if necessary.

The Electronics Platform within the Base Unit comprises a Microprocessor 69, preferably being a microcontroller, within the housing. The Electronics Platform further includes a nonvolatile memory 99 as part of, or connected to, the Microprocessor 69. The Microprocessor 69 is connected to: a Power Supply circuit 71, a Power Line Communications circuit 73, an I/O circuit 75, an Energy monitoring circuit 77, a Surge Protection Device Monitor 79, and a Wireless Communications Circuit 81. An extensive explanation of the components lies outside of the scope of the invention and is not considered necessary for the person of ordinary skill in the art since all functions are well known with apparatus to accomplish same believed to be commercially available. Therefore only a brief review of the component circuit block functionalities and electronic platforms for the modules should be necessary and will be undertaken here.

The Power Supply circuit 71 has a power supply front end protection and filter circuit 83 (or simply "filter circuit" hereafter) connected to the line power terminal jaw 63; and an AC to DC rectifier power supply 85 connected to the filter circuit 83. The Power Line Communications circuit 73 has a power line communications (PLC) high voltage coupling circuit 85 connected to the line jaw 63, and a Power Line Communications device 89 connected to the (PLC) high voltage coupling circuit 85. The six pin multi-pin connector 29 for attachment of the Remotely Operated Control Module 25 is also connected to the Microprocessor 69 via an I2C bus 91 or the like.

The I/O circuit 75 connected to the Microprocessor 69 typically will have circuitry for at least one status indicator such as a visible LED, a reset button for rebooting or resetting the microprocessor device, and a PLC pairing button for pairing the Base Unit module to an external PLC-to-Ethernet wall receptacle device; with each accessible through the top of the Base Unit housing as indicated in FIGS. 1-4.

The Energy monitoring circuit 77 includes an ASSP (application-specific standard product) integrated circuit or the like for monitoring input from the select plurality, here four, of connected CT input receptacles 34 which, extend through the front panel 35 of housing 61. Depending on the monitoring circuit capacity additional plug in receptacles 34a are envisioned. The surge protection device monitor 79 includes a status input receptacle 95 extending through the housing 61 and connectable to a Surge Protection Device 82 for the house typically located elsewhere in the panel. The Surge Protection Device Monitor circuit is then connected through a serial bus 80, as an example for GPIO protocol as labeled, to the microprocessor 69. The Wireless Communications circuit 81 could for example be a Bluetooth LE module having a low energy consumption wireless communications capability.

A signal conditioning unit 97 for the energy monitoring circuit voltage inputs, examples at 77, 111 and 141, is connected between the Power supply filter circuit 83 and the CT extension module connector 27.

Figure 6:
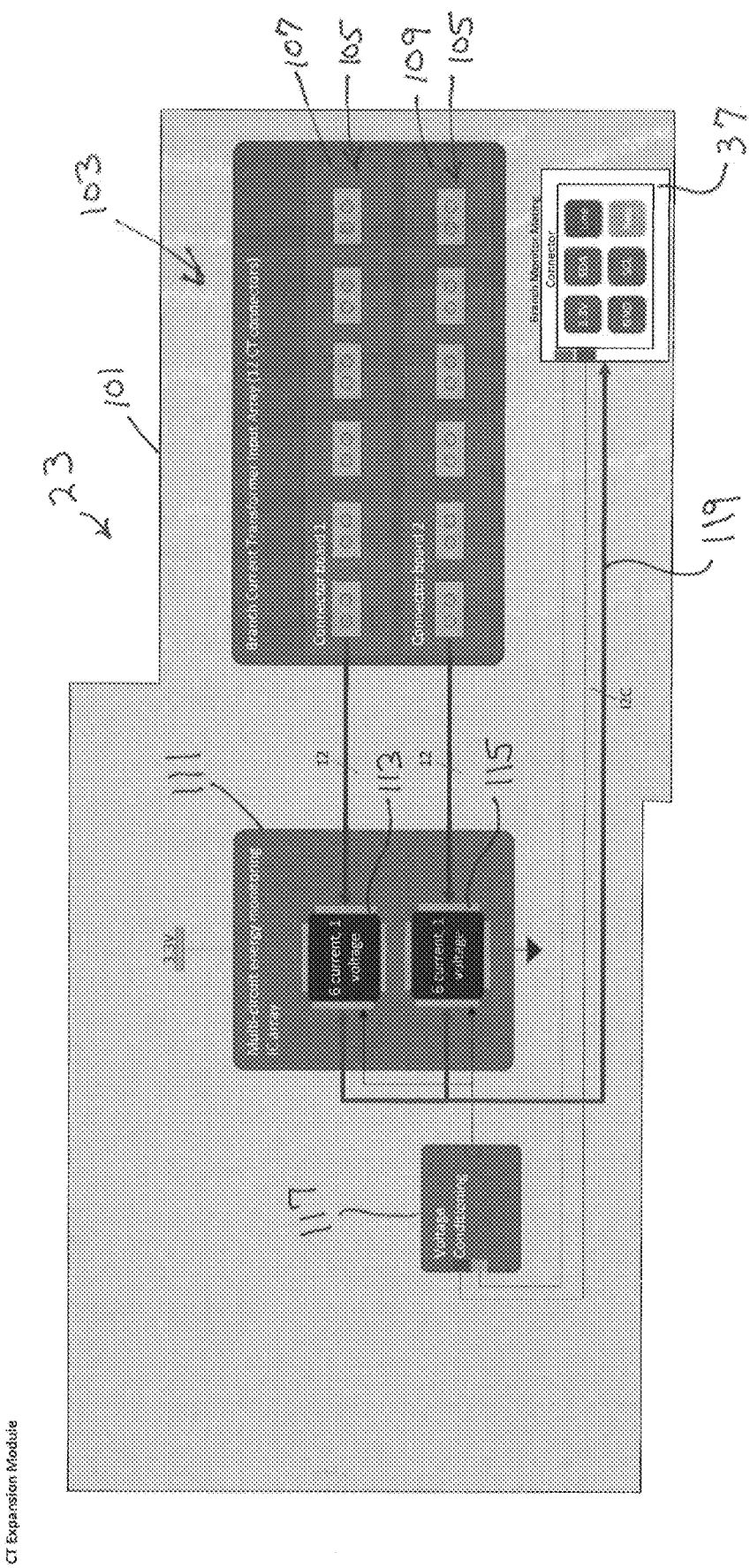
FIG. 6 is an exemplary functional block diagram of the CT Expansion module of the present system.

As seen in FIG. 6, the CT Expansion Module 23 has a self-contained housing 101 for fitting in a single pole breaker slot in the electrical distribution panel 57 and a multi-pin connector 37 for mating with one of the multi-pin connectors of the Base Unit 21 when placed adjacent thereto to enable additional current monitoring CTs (e.g. collectively 42, FIG. 4) to be connected within the electrical distribution panel, typically located around branch wires within the wiring gutters (59, FIG. 4) and allow the information from the additional CTs to be transferred to the Base unit 21.

The CT Expansion Module 23 thus includes a branch CT input array 103 with a plurality (here twelve) of CT connectors, i.e. receptacles, collectively 105, on two connector boards 107, 109. The CT leads are envisioned to pass through the open front panel and removable side panel, per above, to provide connection of the CT toroids to a Multi-Circuit Energy Monitoring IC array 111 comprising two ASSP chips (labeled for 6 current and 1 voltage inputs) 113, 115 inside the module 23 for the monitoring and calculation of various desired energy data, and a voltage conditioning unit 117 for the energy monitoring chips. The Multi-Circuit Energy Monitoring IC array 111 is connected with an I2C bus 119 between the Connector 37 and the chips 113, 115 for various energy monitoring data transfer with the base unit 21. It will be noted that the CT Expansion module 23 is illustrated without a line jaw since it draws power from the Base Unit 21, but it is possible to provide nonconductive jaws on the module 23 just for mechanical securement.

It is envisioned that the multi-pin connector 37 will be a male connector, projectable from the Expansion module 23 case 101 after its placement next to the Base unit module 21. The connector 37 is then preferably lockable in the extended position to provide additional mechanical securement. Various connection methods might be utilized such as 90 degree twist fasteners. A simpler embodiment could utilize snap features for the connector but a downside of snaps may be that if a module needs to be removed, reversal could be difficult. Another embodiment could be a slide type latching system with spring loaded action. The electrical connectors should have significant lead-ins to assist insertion and also have significant strength to help align and guide the add-on modules to the base unit 21.

Figure 7:
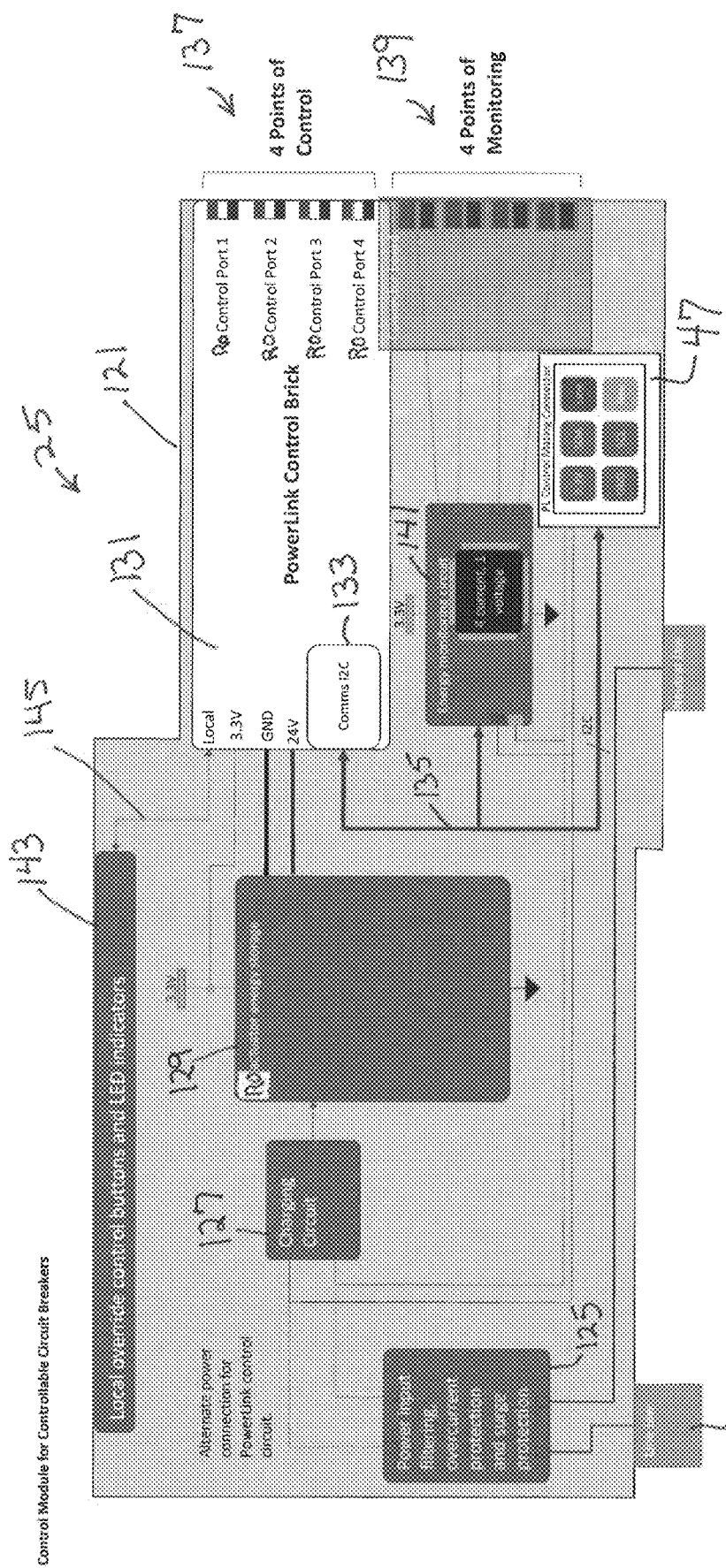
FIG. 7 is an exemplary functional block diagram of the Remotely Operated Control Module of the present system.

As seen in FIG. 7, the Remotely Operated Breaker Control Module 25 (or just "Control Module" for simplicity) has a self-contained housing 121 for a fitting in a breaker slot, here a double pole slot, and having its multi-pin male connector 47 on one side of its housing 121 for mating with one of the multi-pin connectors 29 of the adjacently placed Base Unit 21 to enable monitoring and control of a plurality of Remotely Operated breakers such as the POWERLINK circuit breaker 60 (FIG. 4), mentioned above, provided and attached within the electrical distribution panel 57 and allow information to be exchanged between the Base unit 21 and the Control Module 25. It is envisioned that if the necessary electronic components or the connector requirements shrink, the breaker slot requirement for the control module 25 could be reduced to a single pole slot.

The Control Module 25 has a line jaw 123 connectable to a power bus of the electrical distribution panel. Within the Control Module 25 is a Power Input Filtering Overcurrent Protection and Surge Protection circuit 125 (or just "Input Filter" for simplicity here) connected to the line jaw 123; the Input Filter 125 being connected to a Charging Circuit 127, which is connected to an Remotely Operated circuit breaker actuator Energy Storage Device 129, the Energy Storage Device 129 being connected to a Remotely Operated Control Brick 131 for operation of the Remotely Operated Breakers; the Remotely Operated Control Brick further having a communications link 133 via an exemplary I2C bus 135 with the multi-pin connector 47 and further having a plurality of Remotely Operated breaker control port outputs 137.

The Control Module 25 further has a plurality (here four) of CT Input receptacles 139 extending through the Control module housing 121 and leading to an Energy Monitoring Circuit 141 for an additional plurality of CTs (e.g. collectively 42, FIG. 4) placed within the electrical distribution panel (FIG. 4). The Energy Monitoring Circuit 141 is connected via the I2C bus 135 to the Remotely Operated Control Brick 131 and the Control Module connector 47.

The Control Module 25 further has a top-mounted I/O circuit 143 with Local override control buttons and a status indicator 49, as indicated in FIGS. 1-4; accessible to a human operator through the top of the housing 121. The I/O module 143 is linked in two-way communications to the Remotely Operated Control Brick 131 over a local bus 145.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the invention as defined in the appended claims.

The invention claimed is:

1. In a residential-type load center electrical distribution panel for plug on miniature circuit breakers, the improvement comprising: a) a Base Unit with a self-contained Base Unit housing fitting in a breaker slot of the Load Center for monitoring branch circuit activity and having 1) first and second multi-pin connectors extending through opposite sidewalls of the housing;
   a. the first multi-pin connector on one side of the housing for connecting a current transformer (CT) Expansion Module to an electronics platform within the Base Unit housing,
   b. the second multi-pin connector on the opposite side of the housing for connecting a Control Module for remotely Operated breakers to the electronics platform within the Base Unit housing; and 2) a plurality of CT input receptacles extending through the front of the Base Unit housing: and 3) a line power terminal jaw for attachment to a power bus of the electrical distribution panel; b) an Electronics Platform within the Base Unit housing having: a Microprocessor within the housing, the Microprocessor connected to: 1) a Power Supply circuit, the Power Supply circuit having a rectifier power supply for powering components of the Electronics platform; 2) a Communications circuit, the Communications circuit having a coupling circuit for connection to the electrical grid; and 3) an Energy monitoring circuit; the Energy monitoring circuit having circuitry for monitoring input from the plurality of CT input receptacles in the Base Unit housing.

2. The improvement in a residential-type load center electrical distribution panel for plug on miniature circuit breakers, according to claim 1, wherein the Base Unit housing is a single pole housing.

3. The improvement for a residential-type load center electrical distribution panel for plug on miniature circuit breakers, according to claim 1 further comprising:
   an Expansion Module with a self-contained CT Expansion Module housing for a fitting in a breaker slot and having a multi-pin connector on one side of its Expansion Module housing for mating with one of the multi-pin connectors of the Base Unit housing to allow information from additional CTs to be connected to the Electronics Platform of Base unit housing, including:
      a Branch CT Input Array with a plurality of CT connectors to enable the additional CTs to be connected within the electrical distribution panel via the CT Expansion module housing,
      and a Multi-Circuit Energy Monitoring IC array inside the Expansion module having circuitry for monitoring information from the additional CTs and forwarding the information from the additional CTs to the Base Unit housing.

4. The improvement in a residential-type load center electrical distribution panel for plug on miniature circuit breakers, according to claim 3, wherein the multi-pin connector is a projectable connector.

5. The improvement for a residential-type load center electrical distribution panel for plug on miniature circuit breakers, according to claim 1 further comprising:
   a Control Module with a self-contained Remotely Operated Breaker Control Module housing for a fitting in a breaker slot;
   the Control Module housing having a multi-pin connector on one side of its housing for mating with one of the multi-pin connectors of the Base Unit housing to enable monitoring and control of a plurality of Remotely Operated breakers attached within the electrical distribution panel and allowing information to be exchanged between the Base unit and the Control Module,
   and
      the Control Module having a line jaw connectable to an electrical distribution panel power bus; and
      an Energy Storage Device for providing operating power to Remotely Operated Breakers located within the Electrical Distribution Panel,
      the Energy Storage Device being connected to a Remotely Operated Control Brick for operation of the Remotely Operated Breakers; and
      the Remotely Operated Control Brick further connected via a communications bus with the multi-pin connector and further having a plurality of Remotely Operated breaker control port outputs.

6. The improvement for a residential-type load center electrical distribution panel for plug on miniature circuit breakers, according to claim 5 wherein the Control Module occupies two breaker slots.

7. The improvement for a residential-type load center electrical distribution panel for plug on miniature circuit breakers, according to claim 5 wherein the multi-pin connector is a projectable connector.

8. In a residential-type load center electrical distribution panel for plug on miniature circuit breakers, the improvement comprising: a) a self-contained Base Unit housing fitting in a breaker slot of the Load Center for monitoring branch circuit activity and having: 1) first and second multi-pin connectors extending through opposite sidewalls of the housing; the first multi-pin connector on one side of the housing for connecting a current transformer (CT) Expansion Module to an electronics platform within the Base Unit housing, the second multi-pin connector on the opposite side of the housing for connecting a Control Module for remotely Operated breakers to the electronics platform within the Base Unit housing; and 2) a plurality of CT input receptacles extending through the front of the housing; and 3) a line power terminal jaw for attachment to a power bus of the electrical distribution panel; b) the Electronics Platform within the Base Unit having: a Microprocessor within the housing, the Microprocessor connected to: a Power Supply circuit, a Power Line Communications circuit, an I/O circuit, an Energy monitoring circuit, a Surge Protection Device (SPD) monitor, and a Wireless Communications Circuit; with: 1) the Power Supply circuit having a power supply front end protection and filter circuit connected to the line power terminal jaw; and an AC to DC rectifier power supply connected to the power supply front end protection and filter circuit; 2) the Power line communications circuit having a power line communications (PLC) high voltage coupling circuit connected to the line jaw, and a PLC Communications device connected to the (PLC) high voltage coupling circuit; 3)the I/O circuit having at least one status indicator, a reset button, and a PLC pairing button module accessible through the top of the Base Unit housing; 4) the Energy monitoring circuit having circuitry for monitoring input from the plurality of CT input receptacles extending through the housing and connected to the energy monitoring circuit, 5)) the surge protection device monitor having a status input receptacle extending through the housing and connectable to a Surge Protection Device, 6)the Wireless Communications Circuit having a wireless communications transceiver; and a signal conditioning unit for energy monitor voltage inputs connected between the power supply front end protection and filter circuit and the CT expansion module connector; and the Electronics Platform further including a nonvolatile memory connected to the Microprocessor.

9. The improvement in a residential-type load center electrical distribution panel for plug on miniature circuit breakers according to claim 8, wherein the first and second multi-pin connectors are recessed female six pin connectors.

10. The improvement in a residential-type load center electrical distribution panel for plug on miniature circuit breakers, according to claim 8, wherein the housing is a single pole housing.

11. The improvement for a residential-type load center electrical distribution panel for plug on miniature circuit breakers, according to claim 8 further comprising:
   a CT Expansion Module in a self-contained housing for a fitting in a breaker slot and having a multi-pin connector on one side of its housing for mating with one of the multi-pin connectors of the Base Unit to enable additional CTs to be connected within the electrical distribution panel and allow information from the additional CTs to be connected to the Base unit, and
   including a Branch CT Input Array with a plurality of CT connectors extending from the outside of the CT expansion module housing and connected to a Multi-Circuit Energy Monitoring IC array inside the module; and
   a voltage conditioning unit connected between the multi-pin Connector and the Multi-Circuit Energy Monitoring IC array.

12. The improvement in a residential-type load center electrical distribution panel for plug on miniature circuit breakers, according to claim 11, wherein the multi-pin connector is a projectable connector.

13. The improvement for a residential-type load center electrical distribution panel for plug on miniature circuit breakers, according to claim 8, further comprising:
   a Remotely Operated Breaker Control Module in a self-contained housing for a fitting in a breaker slot and having a multi-pin connector on one side of its housing for mating with one of the multi-pin connectors of the Base Unit to enable monitoring and control of a plurality of Remotely Operated breakers attached within the electrical distribution panel and allow information to be exchanged between the Base unit and the Control Module, and
   the Control Module having a line jaw connectable to an electrical distribution panel power bus;
   a Power Input Filtering Overcurrent Protection and Surge Protection Input Filter circuit connected to the line jaw; the Input Filter connected to a Charging Circuit, which is connected to a Remotely Operated circuit breaker actuator Energy Storage Device, the Energy Storage Device being connected to a Remotely Operated Control Brick for operation of the Remotely Operated Breakers; the Remotely Operated Control Brick further connected via a communications bus with the multi-pin connector and further having a plurality of Remotely Operated breaker control port outputs; and
   the Control Module further having a plurality of CT Input receptacles extending through the Control module housing and leading to an Energy Monitoring Circuit for an additional plurality of CTs within the electrical distribution panel, the Energy Monitoring Circuit connected to the Remotely Operated Control Brick and the Control Module connector,
   and the Control Module further having a top-mounted I/O circuit with Local override control buttons and a status indicator accessible to an operator through the top of the housing; the I/O circuit being linked in two-way communications to the Remotely Operated Control Brick.

14. The improvement for a residential-type load center electrical distribution panel for plug on miniature circuit breakers, according to claim 13 wherein the Control Module occupies two breaker slots.

15. The improvement for a residential-type load center electrical distribution panel for plug on miniature circuit breakers, according to claim 13 wherein the multi-pin connector is a projectable connector.

* * * * *